(12) United States Patent
Yanagita et al.

(10) Patent No.: US 9,263,490 B2
(45) Date of Patent: Feb. 16, 2016

(54) METHODS OF FORMING INTEGRATED CIRCUITS

(75) Inventors: Takeshi Yanagita, Tokyo (JP); Hiroshi Ozaki, Kanagawa (JP); Shin Iwabuchi, Kanagawa (JP); Tomoharu Ogita, Kumamoto (JP)

(73) Assignee: SONY CORPORATION (JP)

( * ) Notice: Subject to any disclaimer, the term of this patent is extended or adjusted under 35 U.S.C. 154(b) by 13 days.

(21) Appl. No.: 13/248,457

(22) Filed: Sep. 29, 2011

(65) Prior Publication Data
US 2012/0086092 A1    Apr. 12, 2012

(30) Foreign Application Priority Data
Oct. 7, 2010   (JP) ................................. 2010-227756

(51) Int. Cl.
*H01L 31/0232* (2014.01)
*H01L 27/146* (2006.01)
*H01L 23/00* (2006.01)

(52) U.S. Cl.
CPC ............ *H01L 27/1464* (2013.01); *H01L 24/05* (2013.01); *H01L 27/14636* (2013.01); *H01L 27/14645* (2013.01); *H01L 27/14689* (2013.01); *H01L 2224/48463* (2013.01)

(58) Field of Classification Search
CPC .............. H01L 24/05; H01L 27/14636; H01L 27/1464; H01L 27/14645; H01L 17/14689; H01L 2224/48463; H01L 27/14627; H01L 27/14643; H01L 2924/00; H01L 27/14603; H01L 27/14609; H01L 27/14685; H01L 27/14
USPC .......................................... 257/431–435, 443
See application file for complete search history.

(56) References Cited

U.S. PATENT DOCUMENTS

| | | | | |
|---|---|---|---|---|
| 5,557,121 | A * | 9/1996 | Kozuka et al. | 257/292 |
| 7,534,656 | B2 * | 5/2009 | Kwon et al. | 438/113 |
| 2009/0096099 | A1 * | 4/2009 | Hsu | 257/738 |
| 2009/0189235 | A1 * | 7/2009 | Ikeda et al. | 257/432 |
| 2009/0280596 | A1 * | 11/2009 | Akiyama | 438/70 |
| 2009/0284631 | A1 * | 11/2009 | Matsuo et al. | 348/294 |
| 2010/0045837 | A1 * | 2/2010 | Yamashita | 348/308 |

FOREIGN PATENT DOCUMENTS

| | | |
|---|---|---|
| JP | 2005-347707 | 12/2005 |
| JP | 2005-353631 | 12/2005 |

* cited by examiner

*Primary Examiner* — Thanh T Nguyen
(74) *Attorney, Agent, or Firm* — Sheridan Ross P.C.

(57) ABSTRACT

A solid-state imaging device includes a substrate in which a plurality of pixels including photoelectric converters are formed, a wiring layer that includes wirings in a plurality of layers formed via an interlayer insulating film in a front surface side of the substrate, a base electrode pad portion that includes a portion of the wirings formed in the wiring layer, an opening that penetrates the substrate from a rear surface side of the substrate and reaches the base electrode pad portion, and an embedded electrode pad layer that is formed so as to be embedded in the opening by electroless plating.

8 Claims, 6 Drawing Sheets

METHODS OF FORMING INTEGRATED CIRCUITS

BACKGROUND

The present disclosure relates to a backside-illuminated solid-state imaging device and a manufacturing method thereof, an electronic apparatus using the solid-state imaging device.

In the related art, in a solid-state imaging device, backside-illuminated solid-state imaging devices are suggested for improving photoelectric conversion efficiency or sensitivity to incident light (Japanese Unexamined Patent Application Publication Nos. 2005-347707 and 2005-353631). In backside-illuminated solid-state imaging devices, photodiodes are formed on a semiconductor substrate as a photoelectric converter, pixel transistors and a wiring layer constituting a signal circuit, or the like, are formed on the front surface side of the semiconductor substrate, and light is incident from the rear surface side of the semiconductor substrate.

In the backside-illuminated solid-state imaging device, a portion of a multilayer wiring formed on the front surface side of the semiconductor substrate is provided as a pad electrode, a desired electric potential is supplied to the multilayer wiring due to the fact that an external terminal is connected to the pad electrode. In this case, a wiring bonding is connected from the rear surface side of the semiconductor substrate in the pad electrode which is formed in a portion of the multilayer wiring.

Figure 6:
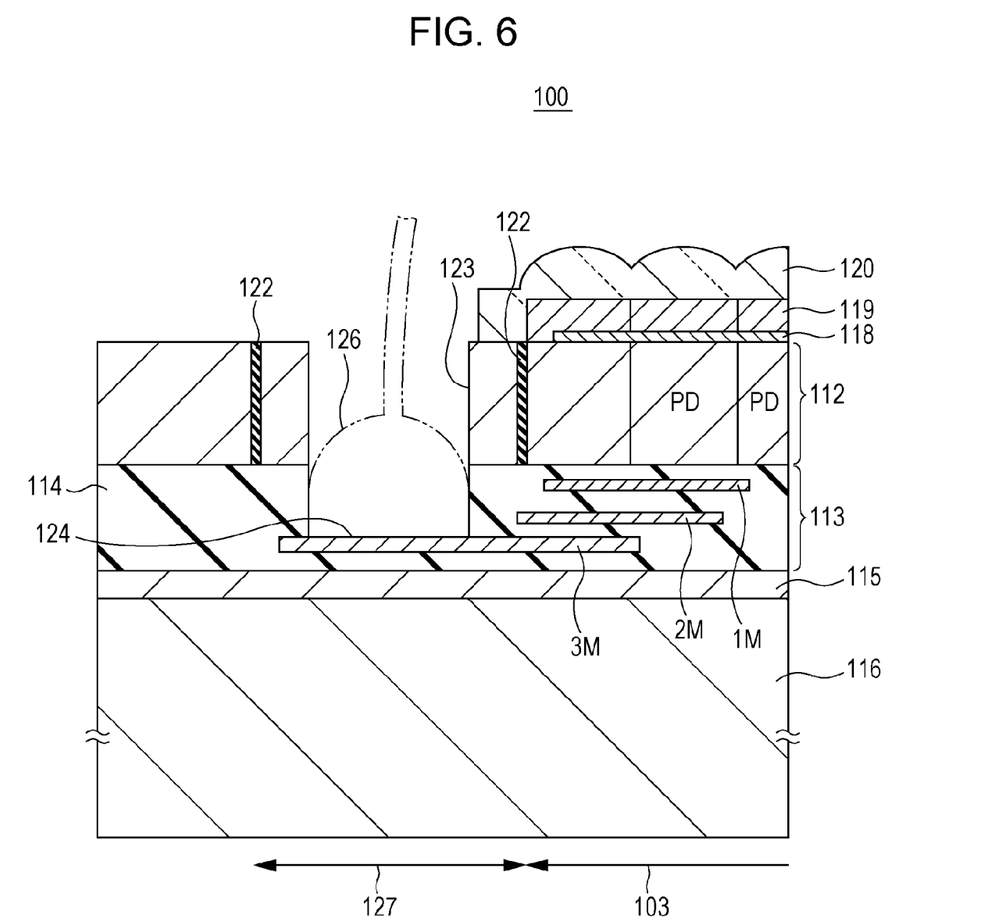
FIG. 6 is a schematic configuration diagram illustrating a main portion of the solid-state imaging device of the related art.

FIG. 6 is a schematic cross-sectional diagram illustrating a main portion of the backside-illuminated solid-state imaging device 100 of the related art. Particularly, the cross-sectional diagram illustrated in FIG. 6 illustrates a region including a pad region 127 formed in the peripheral region of the rear surface side of the backside-illuminated solid-state imaging device.

The backside-illuminated solid-state imaging device 100 includes an imaging region 103 in which photodiodes PD used as the photoelectric converter and a plurality of pixels including a plurality of pixel transistors (MOS transistors) are formed on a silicon substrate 112, and a peripheral circuit portion. In addition, the pad region 127 is formed in the peripheral region. Pixel transistors (not shown) constituting pixels are formed on the front surface side of the silicon substrate 112. Moreover, a wiring layer 113 including wirings 1M to 3M of multilayer structure (three layers in FIG. 6) is formed via an interlayer insulating film 114 in the front surface side of the silicon substrate 112. For example, the wirings 1M to 3M are formed of metal materials such as Cu, Al. In addition, the wiring 3M of the third layer is formed of an Al wiring, and the pad electrode 124 is formed in the pad region 127. A supporting substrate 116 is bonded, for example, by the silicon substrate via an adhesive layer 115 in the front surface side of the wiring layer 113.

On the other hand, an antireflective film 118, a color filter layer 119, and an on-chip lens 120 are formed on the rear surface side of the silicon substrate 112 corresponding to the imaging region 103.

In the pad region 127, an opening 123 for exposing the pad electrode 124 connected to the wiring 3M of the wiring layer 113 is formed. The opening 123 is formed at the same time as the shape forming process of the on-chip lens 120 is performed after forming an organic material constituting the on-chip lens 120, and the opening 123 is formed so that the pad electrode 124 is exposed from the rear surface of the substrate 122. In addition, when the pad electrode 124 is connected to the external terminal, a wire bonding 126, for example, a thin wire of Au (a so-called bonding wire) is connected to the pad electrode 124 which is exposed into the opening 123 in the pad region 127. Thereby, a desired electric potential is supplied from the external terminal.

SUMMARY

However, as described above, the backside-illuminated solid-state imaging device has the configuration in which the supporting substrate is bonded to the upper portion of the wiring layer via the adhesive layer when manufacturing the solid-state imaging device. Since the interlayer insulating layer or the adhesive layer constituting the wiring layer is a weak layer, damage, such cracks due to a force which is applied when the bonding is performed in the electrode pad, is easily generated in the interlayer insulating layer or the adhesive layer.

In addition, in the case where the electrode pad is constituted by aluminum, there are problems in that alloying between the electrode pad and the boding wire is difficult to perform and the boding strength is not obtained.

Moreover, when the electrode pad is constituted by aluminum, the following problems also occur. That is, fluorine corrosion is generated in the electrode pad by a fluorine-based solution which is used during opening formation and becomes tarnished black, or a battery effect is generated by water during dicing and tarnishing is generated.

In addition, since etching for forming the opening in the pad region and the shape of the on-chip lens is performed by dry etching of the same process, optimization in the shape of the on-chip lens is also difficult to achieve. Moreover, since the opening for exposing the electrode pad to the rear surface side of the silicone substrate is formed to penetrate the silicone substrate, there is problem in that the opening is deep and the size of the pad increases.

It is desirable to provide a solid-state imaging device and manufacturing method thereof in which an electrode pad capable of performing stable bonding is formed in a backside-illuminated solid-state imaging device. In addition, it is desirable to provide an electronic apparatus using the solid-state imaging device.

According to an embodiment of the present disclosure, there is provided a solid-state imaging device including a substrate, a wiring layer, a base electrode pad portion, an opening, and an embedded electrode pad layer. A plurality of pixels including photoelectric converters are formed in the substrate. The wiring layer includes wirings in a plurality of layers formed via an interlayer insulating film in a front surface side of the substrate. The base electrode pad portion includes a portion of the wirings formed in the wiring layer. The opening penetrates the substrate from a rear surface side of the substrate and reaches the base electrode pad portion. The embedded electrode pad layer is formed so as to be embedded in the opening by electroless plating.

In the present embodiment, the embedded electrode pad layer is formed in the opening which reaches the base electrode pad portion. Thereby, the step due to the opening is decreased in the pad portion of the rear surface side of the substrate. In addition, connection of an external terminal is performed at the upper surface of the embedded electrode pad layer in the rear surface side of the substrate.

According to another embodiment of the present disclosure, there is provided a manufacturing method of a solid-state imaging device of the present disclosure which is performed by the following processes. First, a plurality of pixels including photoelectric converters are formed in a substrate. Next, a wiring layer including a plurality of wirings is formed via an interlayer insulating film in a front surface side of the substrate. Next, a substrate protective film is formed in a rear surface side of the substrate. Next, an opening is formed so as to penetrate the substrate from the rear surface side of the substrate and reach a base electrode pad portion including a portion of the wirings of the wiring layer. Next, an electrode pad layer is formed for embedding the opening by electroless plating.

In the manufacturing method of the solid-state imaging device of the present disclosure, since metal materials are embedded into the opening by the electroless plating, the embedded electrode pad layer can be easily formed. In addition, since the embedded electrode pad layer is formed so as to be embedded into the opening, the step due to the opening is decreased in the pad region of the rear surface side of the substrate.

According to another embodiment of the present disclosure, there is provided an electronic apparatus including the solid-state imaging device described above, an optical lens which focuses light and makes the light incident on the solid-state imaging device, and a signal processing circuit which processes an output signal output from the solid-state imaging device.

According to the embodiments of the present disclosure, the solid-state imaging device including an electrode pad capable of performing a stable boding can be obtained, and the solid-state imaging device achieving optimization in the shape of the on-chip lens can be obtained. In addition, the electronic apparatus, in which image quality is improved by using the solid-state imaging device, can be obtained.

DETAILED DESCRIPTION OF EMBODIMENTS

Hereinafter, an example of a solid-state imaging device and an electronic apparatus according to embodiments of the present disclosure will be described with reference to FIGS. 1 to 5. The embodiments of the present disclosure are described according to the following order. In addition, the present disclosure is not limited to the following embodiments.

1. First Embodiment: CMOS Type Backside-Illuminated Solid-State Imaging Device
   1-1. Overall Configuration
   1-2. Main Portion Configuration
   1-3. Manufacturing method
2. Second Embodiment: Electronic apparatus

1. First Embodiment

CMOS Type Backside-Illuminated Solid-State Imaging Device

The solid-state imaging device according to a first embodiment of the present disclosure will be described. The present embodiment is exemplified by a CMOS type backside-illuminated solid-state imaging device.

1-1. Overall Configuration

Figure 1:
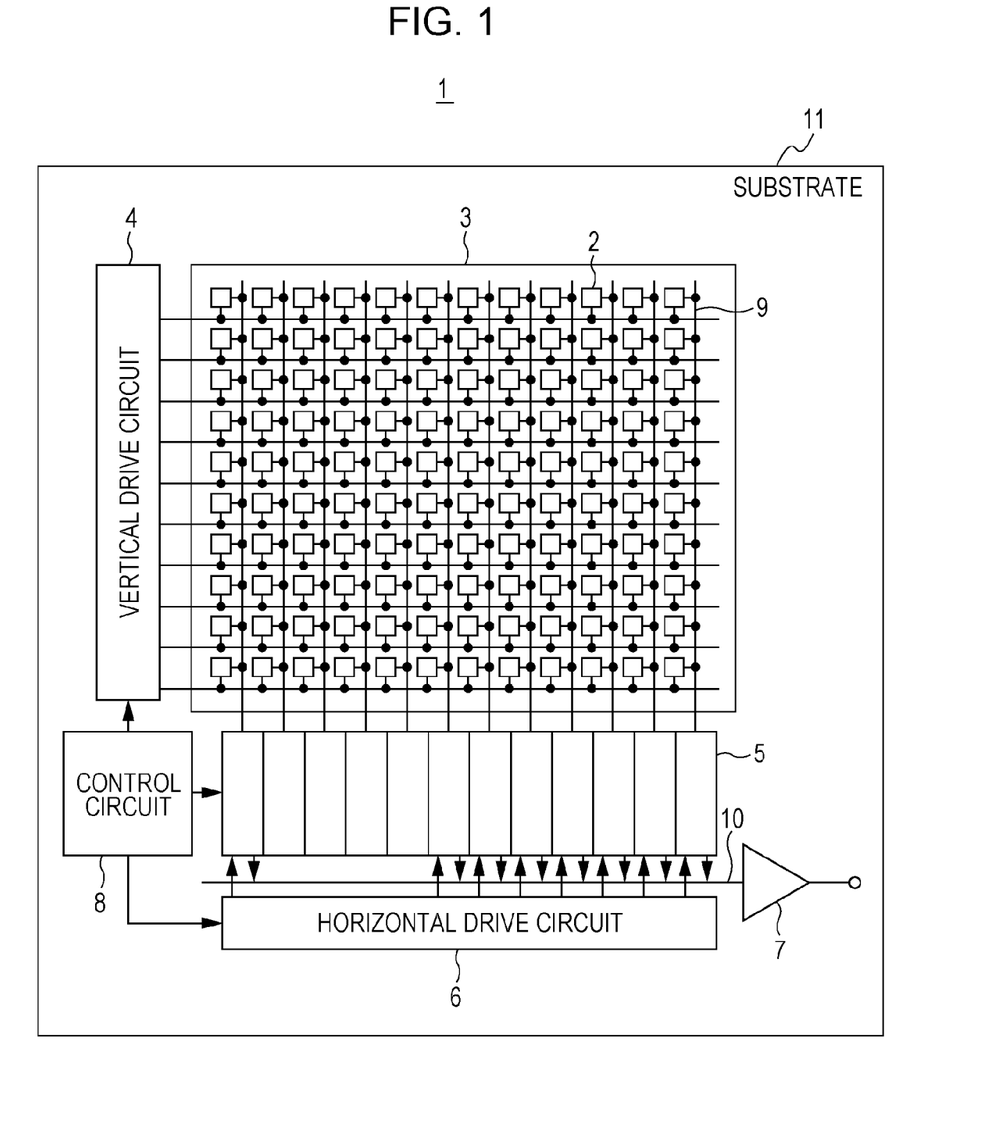
FIG. 1 is a schematic configuration diagram illustrating the overall solid-state imaging device according to a first embodiment of the present disclosure.

First, before describing configuration of a main portion, the overall configuration of the solid-state imaging device 1 of the present embodiment is described. FIG. 1 is a schematic configuration diagram illustrating the overall solid-state imaging device 1 according to the present embodiment.

As illustrated in FIG. 1, the solid-state imaging device 1 includes an imaging region 3 including a plurality of pixels 2, a vertical drive circuit 4, a column signal processing circuit 5, a horizontal drive circuit 6, an output circuit 7, and a control circuit 8, or the like on a substrate 11 which is formed from silicon.

The pixels 2 include a light sensing portion including photodiodes which generate a signal charge in accordance with the quantity of light which is received, and a plurality of MOS transistors for reading and transferring the signal charge. In addition, the pixel 2 is regularly arranged in a plurality in a two-dimensional array on the substrate 11.

The imaging region 3 includes pixels 2 which are regularly arranged in a plurality in a two-dimensional array. In addition, the imaging region 3 includes an effective pixel region which actually receives the light and can store the signal charge generated by a photoelectric conversion, and a black reference pixel region for outputting an optical black which is formed at the periphery of the effective pixel region and becomes a reference of a black level.

The control circuit 8 generates a clock signal or a control signal and the like which are references of operations of the vertical drive circuit 4, the column signal processing circuit 5, and the horizontal drive circuit 6 or the like based on a vertical synchronizing signal, a horizontal synchronizing signal, and a master clock. In addition, the clock signal or the control signal, and the like generated in the control circuit 8 are input to the vertical drive circuit 4, the column signal processing circuit 5, the horizontal drive circuit 6, or the like.

The vertical drive circuit 4 includes, for example, shift registers, and selectively scans each pixel 2 of the pixel region 3 by a row unit in a sequentially vertical direction. In addition, the vertical drive circuit 4 supplies the pixel signal based on the signal charge, which is generated in a photoelectric conversion element of each pixel 2, to the column signal processing circuit 5 through a vertical signal line 9.

For example, the column signal processing circuit 5 is disposed at every row of the pixels 2, and performs signal processing such as noise removal or signal amplification of the signal output from the pixels 2 for one row by the signal from the black reference pixel region (not shown formed at the periphery of the effective pixel region) at every pixel row. A horizontal selection switch (not shown) is installed in the output stage of the column signal processing circuit 5 between the column signal processing circuit 5 and a horizontal signal line 10.

For example, the horizontal drive circuit 6 includes shift registers, sequentially selects each column signal processing circuit 5 by sequentially outputting a horizontal scan pulse, and outputs the pixel signal from each column signal processing circuit 5 to the horizontal signal line 10.

The output circuit 7 performs signal processing with respect to the pixel signal which is sequentially supplied through the horizontal signal line 10 from each column signal processing circuit 5 and outputs the processed signal.

1-2. Main Portion Configuration

Figure 2:
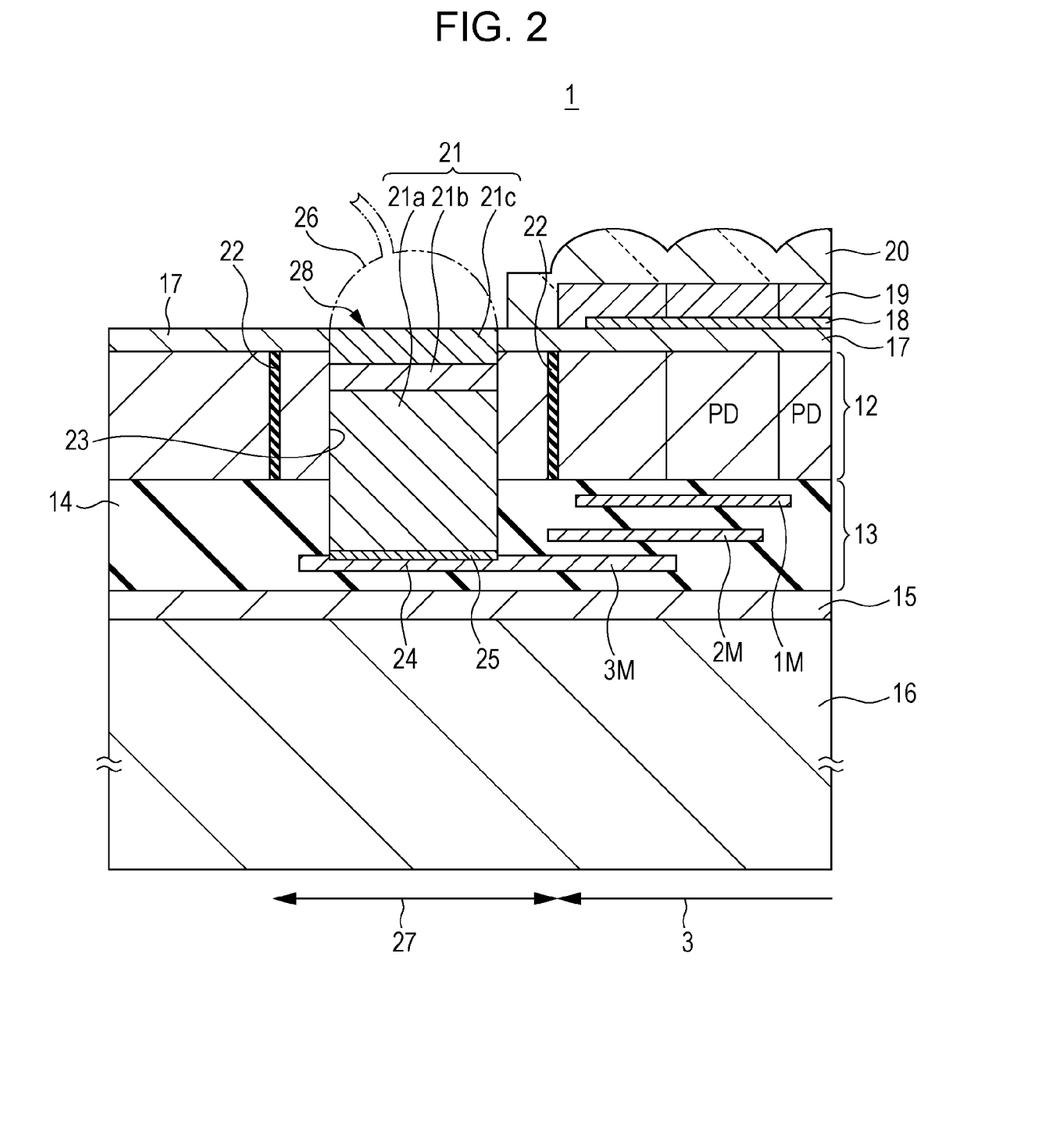
FIG. 2 is a schematic cross-sectional configuration diagram illustrating a main portion of the solid-state imaging device according to the first embodiment of the present disclosure.

FIG. 2 illustrates a schematic cross-sectional configuration of a main portion of the solid-state imaging device 1 according to the embodiment of the present disclosure. FIG. 2 illustrates the cross-section in the imaging region 3 and a pad region 27 which is formed in the periphery of the imaging region 3.

As illustrated in FIG. 2, the solid-state imaging device 1 of the present embodiment includes a substrate 12 and a wiring layer 13 which is formed on the front surface side of the substrate 12. In addition, the solid-state imaging device 1 includes a supporting substrate 16 which is adhered via an adhesive layer 15 to the surface of the side opposite to the substrate side of the wiring layer 13. Moreover, a substrate protective film 17, an antireflective film 18, a color filter layer 19, and an on-chip lens 20 are provided in the rear surface side which is a light incident side of the substrate 12, and an embedded electrode pad layer 21, which is formed so as to be embedded to an opening 23 penetrating the substrate 12, is provided in a pad region 27.

The substrate 12 is constituted by silicon semiconductor, and for example, has a thickness of 2000 nm to 6000 nm. As described above, a plurality of pixels 2 including photoelectric converters and a plurality of pixel transistors (not shown) are formed in the imaging region 3 of the substrate 12. A photoelectric converter is constituted by photodiode PD, and generates the signal charge in accordance with the quantity of the light incident from the rear surface side of the substrate 12. In addition, the signal charge generated at the photodiode PD is read by a pixel transistor and output as the pixel signal. Moreover, even though not shown in FIG. 2, a periphery circuit including the vertical drive circuit 4 and the horizontal drive circuit 6 is formed in the substrate 12.

The wiring layer 13 is formed at the surface side opposite to the light incident side of the substrate 12, and includes wirings 1M to 3M which are laminated by a plurality of layers (three layers in FIG. 2) via the interlayer insulating film 14. Between desired wirings or between the wirings 1M to 3M and pixel transistors (not shown) is connected by contact portions (not shown). Thereby, the pixel transistor of each pixel is driven from the wiring layer 13. In addition, a base electrode pad portion 24 is formed by the third wiring 3M which is the uppermost layer (lower layer in FIG. 2) in the pad region 27. As the constituent material of the wirings 1M to 3M constituting the wiring layer 13, for example, metal materials such as aluminum (A) or copper (Cu) can be used. In the present embodiment, the wirings 1M and 2M until the second layer are formed from copper, and the wiring 3M of the third layer, in which the base electrode pad portion 24 is formed, is formed from aluminum. As the constituent material of the contact portion connecting between wirings or between the wirings and the pixel transistors, for example, metal materials such as tungsten or copper can be used. In addition, in FIG. 2, the wiring 3M of the third layer is illustrated only as the base electrode pad portion 24. However the wiring 3M can be used as a general wiring in the other regions.

The substrate protective film 17 is constituted by $SiO_2$ and formed on the rear surface of the substrate 12. The substrate protective film 17 is a layer which is formed to protect the rear surface of the substrate 12 so that metal materials are not deposited on the rear surface side of the substrate 12 when the embedded electrode pad layer 21 described below is formed by electroless plating. Thereby, the substrate protective film 17 is formed so as to coat the entire region except for the region in which the embedded electrode pad layer 21 is formed.

The antireflective film 18 is formed on the substrate protective film 17 in the imaging region 3 by insulating films of one layer or a plurality of layers. When the antireflective film 18 is formed in a plurality of layers, for example, the antireflective film 18 can be formed so that structure having three layers of a silicon oxide film, silicon nitride film, and silicon oxynitride film in order is formed in the rear surface side of the substrate 12. In this case, the silicon oxide film formed in the first layer may be constituted so as to be the silicon oxide film which is used as the substrate protective film 17.

The color filter layer 19 is formed on the upper portion of each pixel 2 in the imaging region 3, and the color filter layer 19 is constituted so that, for example, light such as green, red, blue, cyan, yellow, black, or white selectively permeates each pixel 2. For each pixel 2, a color filter layer 19 which transmits a different color may be used, or a color filter layer 19 which transmits the same color may be used for all pixels 2. Combination of colors in the color filter layer 19 can be variously selected according to the specification.

The on-chip lens 20 is formed on the upper portion of the color filter layer 19 and the surface of the on-chip lens 20 is formed in convex for each pixel 2. The incident light is focused by the on-chip lens 20 and is efficiently incident to the photodiode PD of each pixel 2. As the constituent material of the on-chip lens 20, for example, organic materials having a refractive index of 1.0 to 1.3 can be used.

The embedded electrode pad layer 21 is constituted by a metal material layer which is formed so as to be embedded into the opening 23 by electroless plating, and the opening 23 is formed from the rear surface side of the substrate 12 until reaching the base electrode pad portion 24 formed in the wiring layer 13. In the present embodiment, the embedded electrode pad layer 21 is constituted by the structure of three layers of a first metal material layer 21a, a second metal material layer 21b, and a third metal material layer 21c which are embedded by electroless plating in order from the base electrode pad portion 24. In the present embodiment, the first metal material layer 21a is formed from Ni, the second metal material layer 21b is formed from Pd, and the third metal material layer 21c is formed from Au. In addition, the embedded electrode pad layer 21 is formed via an adhesion layer 25 on the upper portion of the base electrode pad portion 24.

The upper surface of the third metal material layer 21c formed in the uppermost layer (the light incident surface side of the substrate 12) is formed so as to be substantially flush with the surface of the substrate protective film 17, and the surface of the third metal material layer 21 is formed as an electrode pad portion. That is, in the connection with an external terminal, the surface of the third metal material layer 21c is connected to a wire bonding 26. In addition, an insulating layer 22 constituted by $SiO_2$ is formed so as to enclose the embedded electrode pad layer 21 in the substrate region enclosing the embedded electrode pad layer 21. By the insulating layer 22, the imaging region 3 formed on the substrate 12 or the peripheral region is constituted so as not to be electrically connected to the embedded electrode pad layer 21.

1-3. Manufacturing Method

Next, the manufacturing method of the solid-state imaging device 1 of the present embodiment will be described. FIGS. 3A to 4C are diagrams illustrating the manufacturing process of the solid-state imaging device 1 shown in FIG. 2.

Here, similarly to general manufacturing method of the solid-state imaging device, after the wiring layer 13 is formed on the surface of the substrate 12, the supporting substrate 16 is adhered to the upper portion of the wiring layer 13 via the adhesive layer 15 and inverted, and the substrate 12 is ground to a predetermined thickness. Thus, the manufacturing process of the present disclosure is described after a process of grinding the substrate 12 to a predetermined thickness. In addition, in the cross-sectional configuration of FIG. 2, photodiode PD and pixel transistors (not shown) are formed on the substrate 12 in advance. Moreover, the insulating layer 22, which is formed in the pad region 27 of the substrate 12, is formed by forming an opening groove from the front surface side of the substrate 12 into the depth direction of the substrate 12 and embedding insulation materials such as $SiO_2$ or SiN into the opening groove in the region enclosing the region in which the embedded electrode pad layer 21 is formed before the wiring 13 is formed.

Figure 3A:
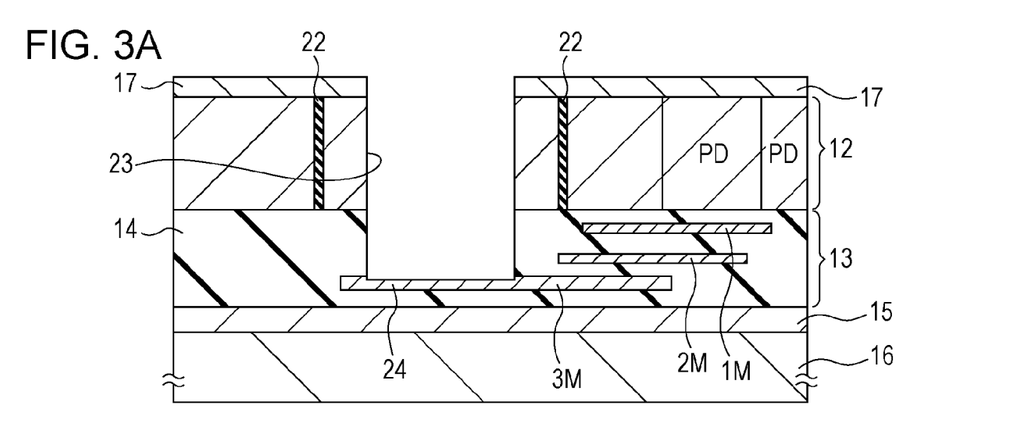
FIGS. 3A to 3C are schematic process diagrams illustrating a manufacturing method of the solid-state imaging device according to the first embodiment of the present disclosure.

After the rear surface of the substrate 12 is ground to a predetermined thickness, as illustrated in FIG. 3A, the substrate protective film 17, which is constituted by $SiO_2$, is formed on the rear surface side of the substrate 12. Thereafter, a register mask (not shown), in which the region in which the embedded electrode pad layer 21 is formed is opened, is formed on the upper portion of the substrate protective film 17. In addition, the substrate protective 17, the substrate 12, the interlayer insulating film 14 are removed by etching until reaching the base electrode pad portion 24 formed in the wiring layer, and therefore, the opening 23 exposing the base electrode pad portion 24 of the wiring layer 13 is formed. The etching can be performed by using gas such as $CF_4/O_2$, $CF_4$, $SF_6/O_2$, and the gas can be changed according to the materials to be etched. For example, $CF_4$-based gas is used for etching the wiring layer 13 and the substrate protective film 17, and $SF_6$-based gas is used for etching the substrate 12 constituted by silicon. In addition, for example, the etching processing is performed within a chamber of 40° C.

In addition, in the step in which the opening 23 is formed, due to the fact that the base electrode pad portion 24 constituted by aluminum is exposed, a natural oxide film (not shown) is formed on the surface of the base electrode pad portion 24. Thereby, after the opening 23 is formed, the natural oxide film formed in the surface of the base electrode pad portion 24 is removed by performing a phosphorous acid treatment. For example, the phosphorous acid treatment is performed in 50° C. of the treatment temperature and for 180 seconds of the treatment time by using a mixed solution including NaOH and $Na_2SO_4$.

Figure 3B:
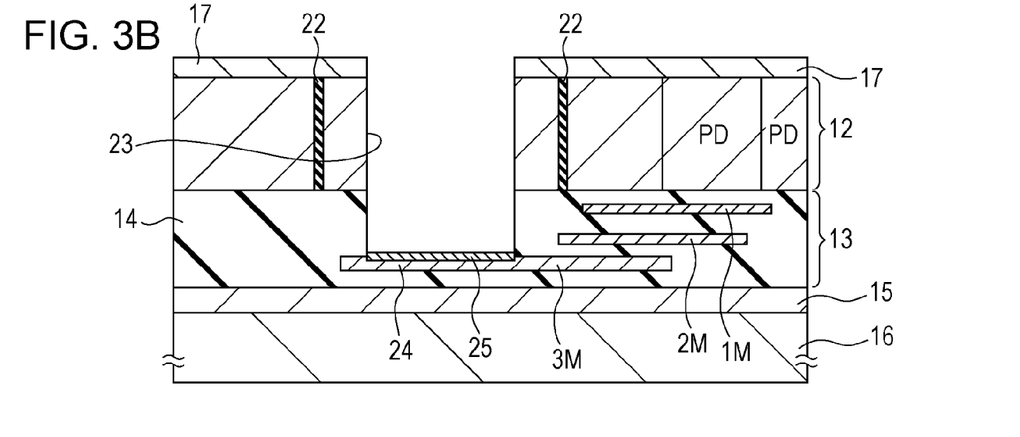

Next, as illustrated in FIG. 3B, the adhesion layer 25 is formed due to the fact that the surface of the base electrode pad portion 24 is zincked by performing a zincate treatment on the exposed surface of the base electrode pad portion 24. The zincate treatment forming the adhesion layer 25 is preferably performed twice. In the first zincate treatment, since Zn particles which are formed on the surface of the base electrode pad portion 24 constituted by Al are coarse and the embedded electrode pad layer 21 formed in the subsequent process also is coarse, the adherence or the connectivity is deteriorated. The Zn particles formed on the surface of the base electrode pad portion 24 can be made dense by performing the second zincate treatment, and therefore, the adhesive layer 25 can be formed with high accuracy.

For example, the first and second zincate treatments are performed for 60 seconds in the treatment time by using 7 g/L of zinc oxide solution.

Figure 3C:
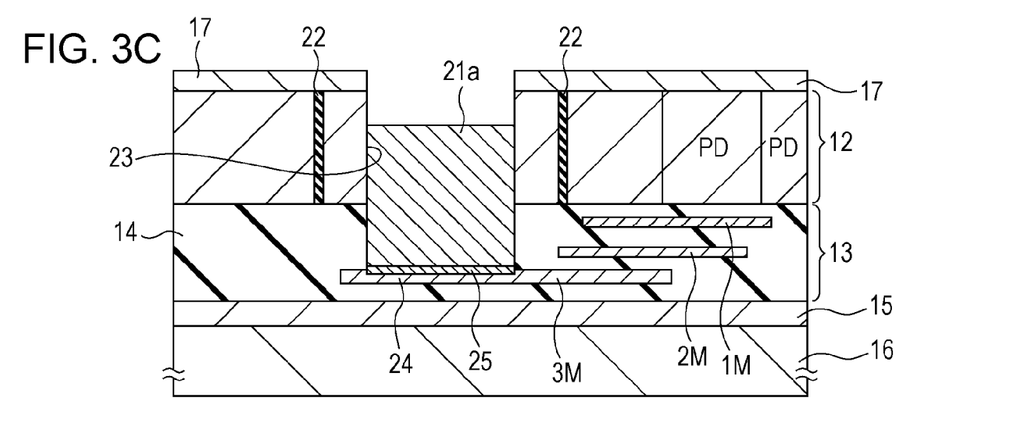

Next, as illustrated in FIG. 3C, Ni is deposited on the upper portion of the based electrode pad portion 24, in which the adhesion layer 25 is formed, by electroless plating, and the first metal material layer 21a constituted by Ni is formed. For example, the first metal material layer 21a constituted by Ni is deposited in the opening 23 so as to have a film thickness of 7 to 8 μm from the bottom portion of the opening 23.

For example, the electroless plating of Ni is performed in 85° C. of the treatment temperature and for 840 seconds in the treatment time by using mixed solution of $NiSO_4$ and $NaH_2PO_2$.

Figure 4A:
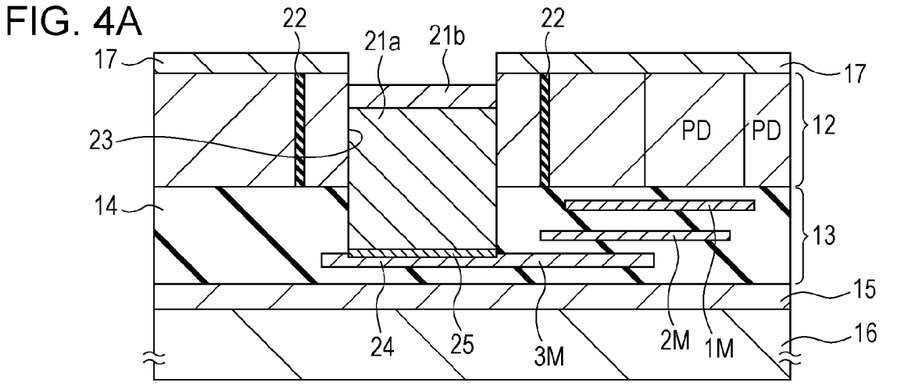
FIGS. 4A to 4C are schematic process diagrams illustrating the manufacturing method of the solid-state imaging device according to the first embodiment of the present disclosure.

Next, as illustrated in FIG. 4A, Pd is deposited on the first metal material layer 21a constituted by Ni by electroless plating, and the second metal material layer 21b constituted by Pd is formed. For example, the second metal material layer 21b constituted by Pd is deposited in the opening 23 so as to have a film thickness of 0.03 to 0.1 μm. Due to the fact that the second metal material layer 21b constituted by Pd is formed, the relative diffusion between the first metal material layer 21a constituted by Ni and the third metal material layer 21c constituted by Au which is formed on the upper portion of the second metal material layer 21b is prevented from generating. For example, the electroless plating of Pd is performed in 20° C. to 50° C. of the treatment temperature and for 5 to 10 minutes in the treatment time by using ammonia solution of Pd(NH3)2(NO2)2 in which concentration of metal Pd is 0.8 to 1.2 (g/L) and pH is 7.3 to 7.9. In this case, the deposition rate is 0.4 to 0.8 (μm/hr). In addition, in the present embodiment, ammonia solution in which the concentration of the metal Pd is 1 (g/L) and pH is 7.6 is used.

Figure 4B:
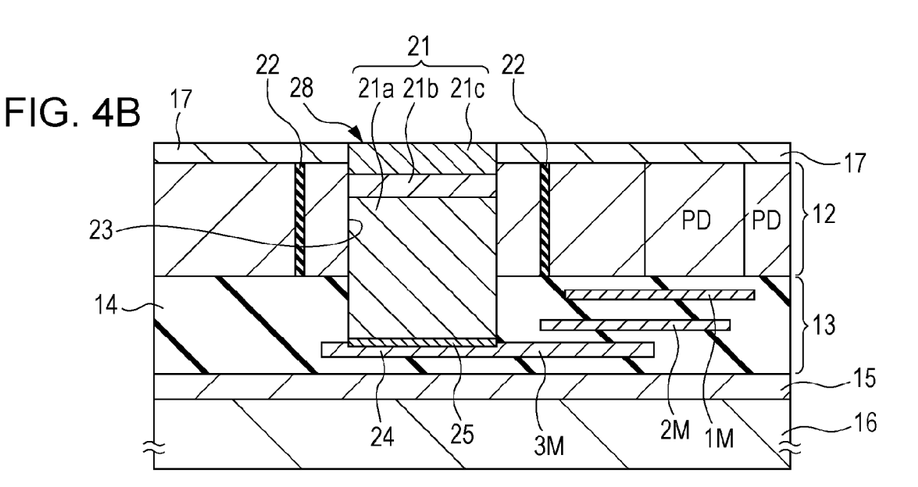

Next, as illustrated in FIG. 4B, Au is deposited on the second metal material layer 21b constituted by Pd through the electroless plating, and therefore, the third metal material layer 21c constituted by Au is formed. For example, the third metal material layer 21c constituted by Au is deposited in the opening 23 so as to have a film thickness of 0.1 to 0.5 μm. The electroless plating of Au is performed in 20° C. to 50° C. of the treatment temperature and for 5 to 10 minutes in the treatment time by using solution containing gold cyanide salt in which concentration of metal Au is 1.5 to 2.5 (g/L) and pH is 4.5 to 5.0. In this time, the deposition rate is 0.03 to 0.06 (μm/10 min). In addition, in the present embodiment, solution in which the concentration of the metal Au is 2 (g/L) and pH is 4.8 is used.

In addition, the opening 23 is embedded by the first, the second, and the third metal material layers 21a to 21c which are formed in the processes of FIGS. 3C to 4C, and the embedded electrode pad layer 21 is formed. Moreover, the third metal material layer 21c formed in the top surface is preferably formed so as to be substantially flush with the surface of the substrate protective film 17. Further, the third metal material layer formed in the top surface becomes an electrode pad portion 28 to which the external terminal is connected.

Figure 4C:
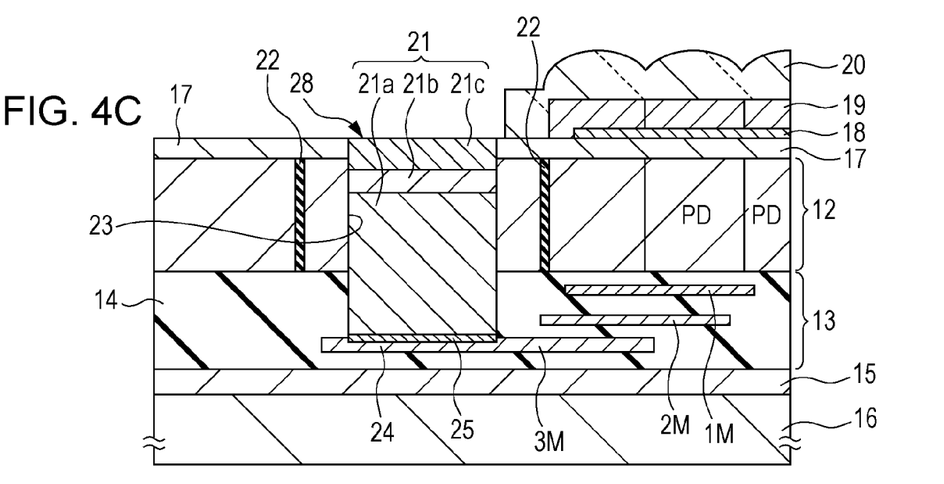

In addition, since the substrate protective film 17 is formed on the rear surface side of the substrate 12, in the forming processes of the first, the second, and the third metal material layers 21a to 21c by the electroless plating, the substrate protective film 17 is formed in the rear surface side of the substrate 12. Therefore, the film of the metal material layer is not formed on the rear surface side of the substrate 12, and the metal material is deposited in only the opening 23.

Thereafter, as illustrated in FIG. 4C, similarly to general manufacturing method, the antireflective film 18, the color filter layer 19, and the on-chip lens 20 are formed on the upper portion of the substrate protective film 17 in the imaging region 3. Therefore, the solid-state imaging device 1 according to the present embodiment is completed. In the present embodiment, since the opening 23 is embedded by the embedded electrode pad layer 21 in the pad region 27, a step is not present in the rear surface side of the substrate 12. Thereby, in the process of applying organic materials when forming the color filter layer 19 or the on-chip lens 20, uneven application is suppressed. Therefore, the color filter layer 19 and the on-chip lens 20 can be formed in the imaging region 3 with high accuracy.

In addition, in the solid-state imaging device 100 of the related art as illustrated in FIG. 6, since the opening 123 of the pad region 127 is formed in the same process as the etching process for forming the shape of the on-chip lens 120, optimization in the shape of the on-chip lens 120 is difficult to be achieved. However, in the present embodiment, during the etching process for forming the shape of the on-chip lens 20, the electrode pad portion 28 is previously formed, and the process for forming the opening 123 and the process for forming the shape of the on-chip lens 20 are separated from each other in the pad region 27. Thereby, optimization in the shape of the on-chip lens 20 can be achieved. In addition, since the top surface of the embedded electrode pad layer 21 is constituted by Au, the pad layer 21 is not corroded by wet process or the like at the time of forming the color filter layer 19 or the on-chip lens 20. Thereby, a problem of a black-tarnishing, which occurs in the electrode pad portion constituted by Al in the related art, or a problem of fluorine adsorption can be avoided.

Moreover, in the solid-state imaging device 1 of the present embodiment, since the embedded electrode pad layer 21 can be formed by electroless plating, it is not necessary to form a seed layer which is necessary in electroplating, and the metal materials can be easily deposited.

In addition, in the solid-state imaging device 1 of the present embodiment, since the electrode pad portion 28 to which the external terminal is connected is constituted of the third metal material layer 21c constituted by Au in the top surface of the embedded electrode pad layer 21, in the case where wire bonding is performed by a thin wire of Au or the like, the same material can be applied to the bonding. Thereby, the bonding can be performed at a lower power, and therefore, the bonding connection can be easily performed.

In addition, in the solid-state imaging device 1 of the present embodiment, since the opening 123 is embedded by the embedded electrode pad layer 21, the electrode pad portion 28 is formed at the rear surface side of the substrate 12. Thereby, it is not necessary to put the wire bonding into the opening 23, which is necessary in the related art, and the connection between the wire bonding and the external terminal can be easily achieved. In addition, the area of the electrode pad portion 28 can be reduced. Moreover, since the wire bonding 26 can be positioned to be separated from weak layers such as wiring layer 13 or the adhesive layer 15 which is formed on the front surface side of the substrate 12, occurrence of cracking at the same time of the wire bonding can be decreased.

In the present embodiment, the insulation between the embedded electrode pad layer 21 and the substrate 12 is performed by the insulating layer 22 which is formed by forming the opening groove in the substrate 12 and embedding insulating materials into the opening groove. However, the present disclosure is not limited thereto. For example, due to the fact that the insulating film coating the side wall of the opening 23 is formed after the opening 23 to which the base electrode pad portion 24 is exposed is formed, the insulation between the embedded electrode pad layer 21 and the substrate 12 may be held. In this case, after the process of FIG. 3A, insulating films are formed on the surface of the substrate 12 including the side wall and the bottom portion of the opening 23, and the insulating film remains at only a side wall of the opening 23 by performing the etching.

In addition, in the present embodiment, the wiring 3M is constituted by aluminum as the base electrode pad portion 24, however, the wiring 3M may be formed from copper. Even in the case where the wiring formed from copper is used as the base electrode pad portion 24, similarly to the present embodiment, the formation of the embedded electrode pad layer 21 can be performed by the electroless plating.

Moreover, in the present embodiment, among the embedded electrode pad layer 21, the layer constituting the electrode pad portion 28 to which the wire bonding 26 is connected is formed from Au. However, other than the above, the layer may be formed as metal materials including stable characteristics, such as Ag.

The application of the present disclosure is not limited to the solid-state imaging device which detects the distribution of the incident light amount of the visual light and images the distribution as the image. That is, the present disclosure may be also applied to a solid-state imaging device which images the distribution of the incident amount of infrared light, X ray, particles and the like as the image. In addition, as broad sense, the present disclosure may be applied to the entire solid-state imaging device including a solid-state imaging device (a physical quantity distribution detecting device) such as a fingerprint detection sensor which detects distribution of other physical quantities, such as pressure or electrostatic capacity, and images them as the images.

In addition, the present disclosure is not limited to the solid-state imaging device which scans each unit pixel of the pixel portion in order by row unit and reads the pixel signal from each unit pixel. The present disclosure may be applied to a solid-state imaging device of an X-Y address type which selects arbitrary pixels by pixel unit and reads the signals from the selected pixels by pixel unit.

Moreover, the solid-state imaging device may be a shape which is formed as one chip or form of a modular shape including imaging function in which a pixel portion, a signal processing portion, and an optical system are collected and packaged.

In addition, the present disclosure is not limited to application to the solid-state imaging device, and may be also applied to imaging devices. Here, the imaging device means camera systems such as a digital still camera or a video camera, or electronic apparatuses including imaging function such as a mobile phone. Moreover, the imaging device includes an imaging device having the form of a module mounted on the electronic apparatus, that is, a camera module.

2. Second Embodiment

Electronic Apparatus

Figure 5:
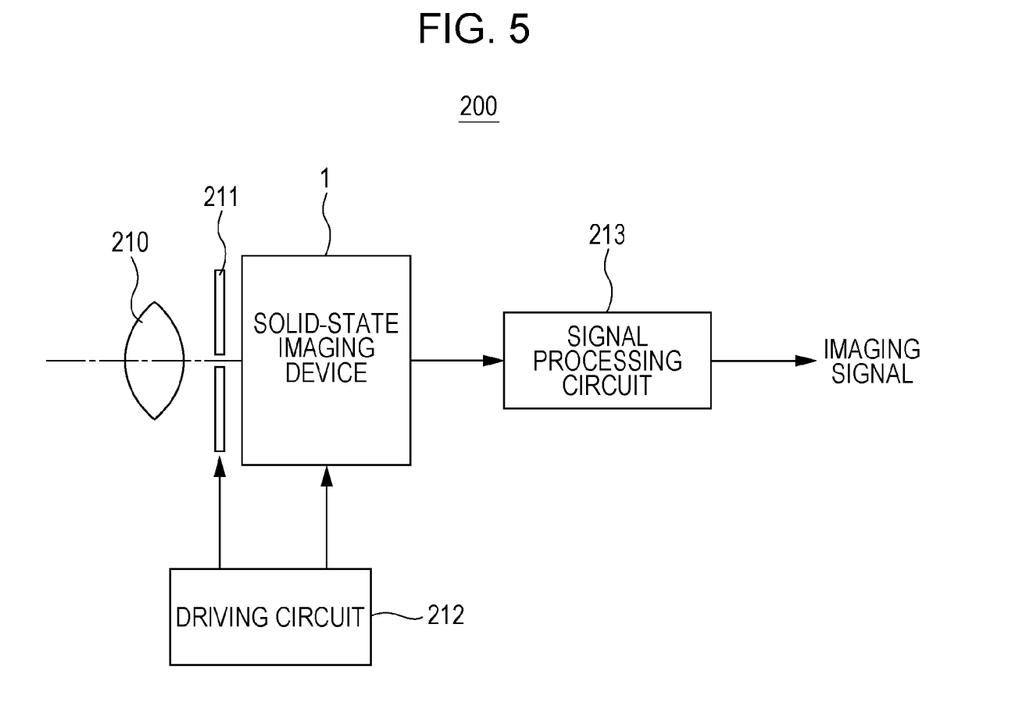
FIG. 5 is a schematic configuration diagram illustrating an electronic apparatus according to a second embodiment of the present disclosure.

Next, an electronic apparatus according to a second embodiment of the present disclosure will be described. FIG.

5 is a schematic configuration diagram illustrating the electronic apparatus 200 according to the second embodiment of the present disclosure.

The electronic apparatus 200 of the present embodiment is the embodiment in the case where the solid-state imaging device 1 of the above-described first embodiment of the present disclosure is used as the electronic apparatus (camera).

The electronic apparatus 200 according to the present embodiment includes the solid-state imaging device 1, an optical lens 210, a shutter unit 211, a driving circuit 212, and a signal processing circuit 213.

The optical lens 210 images an image light (incident light) from subject on the imaging surface of the solid-state imaging device 1. Thereby, the signal charge is stored in the solid-state imaging device 1 for a predetermined interval.

The shutter unit 211 controls the light irradiation interval and the light shield interval into the solid-state imaging device 1.

The driving circuit 212 supplies the driving signal which controls the transfer operation of the solid-state imaging device 1 and the shuttering operation of the shutter unit 211. The signal transfer of the solid-state imaging device 1 is performed by the driving signal (timing signal) supplied from the driving circuit 212. The signal processing circuit 213 performs a variety of signal processings. The image signal which is subjected to the signal processing is stored on the storage medium, such as memory, or output to a monitor.

In the electronic apparatus 200 of the present embodiment, stable bonding can be achieved and optimization of the shape of the on-chip lens is improved in the solid-state imaging device 1. Therefore, the image quality is improved.

The electronic apparatus 200 to which the solid-state imaging device 1 can be applied is not limited to a camera. That is, the electronic apparatus 200 can be applied to an imaging device such as a digital still camera and a camera module for a mobile device in a mobile phone or the like.

The present disclosure contains subject matter related to that disclosed in Japanese Priority Patent Application JP 2010-227756 filed in the Japan Patent Office on Oct. 7, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a substrate in which a plurality of pixels including photoelectric converters are formed;
    a wiring layer that includes wirings in a plurality of layers formed via an interlayer insulating film on a front surface side of the substrate;
    a base electrode pad portion that includes a portion of the wirings formed in the wiring layer;
    a substrate protective film on a rear surface side of the substrate;
    an opening that penetrates the substrate protective film and the substrate from the rear surface side of the substrate and reaches the base electrode pad portion, wherein the rear surface side is a light incident side of the substrate;
    an embedded electrode pad layer that is embedded in the opening, wherein the embedded electrode pad layer includes:
        an adhesion layer that is in electrical contact with the base electrode pad portion;
        a first metal material layer that is deposited on the adhesion layer;
        a second metal material layer deposited on the first metal material layer; and
        a third metal material layer that is deposited on the second metal material layer, wherein a surface of the third metal material layer is substantially flush with a surface of the substrate protective film;
    an insulating layer, wherein the insulating layer extends through the substrate and electrically separates an imaging region containing at least some of the photoelectric converters from the embedded electrode pad layer.

2. The solid-state imaging device according to claim 1, wherein at least the third metal material layer of the embedded electrode pad layer includes a metal material layer including Au or Ag.

3. The solid-state imaging device according to claim 2, wherein the first metal material layer includes a metal material layer including Ni formed by electroless plating.

4. The solid-state imaging device according to claim 1, wherein the embedded electrode pad layer includes an Ni layer as the first metal material layer, a Pd layer as the second metal material layer, and an Au layer as the third metal material layer in order from the base electrode pad portion side.

5. The solid-state imaging device according to claim 1, wherein the front surface side of the substrate is opposite the light incident side of the substrate.

6. The solid-state imaging device according to claim 1, wherein the insulating layer encloses the embedded electrode pad layer.

7. The solid-state imaging device according to claim 1, wherein the adhesion layer is between the base electrode pad portion and the first metal material layer of the embedded electrode pad layer.

8. The solid state imaging device of claim 1, wherein the first metal material layer extends through a portion of the wiring layer and a portion of the substrate, wherein the second metal material layer extends through a portion of the substrate, and wherein the third metal material layer extends through a portion of the substrate and through the substrate protective film.

* * * * *